(12) United States Patent
Sankin et al.

(10) Patent No.: US 7,242,040 B2
(45) Date of Patent: Jul. 10, 2007

(54) LATERAL TRENCH FIELD-EFFECT TRANSISTORS IN WIDE BANDGAP SEMICONDUCTOR MATERIALS, METHODS OF MAKING, AND INTEGRATED CIRCUITS INCORPORATING THE TRANSISTORS

(75) Inventors: Igor Sankin, Starkville, MS (US); Jeffrey B. Casady, Starkville, MS (US); Joseph N. Merrett, Starkville, MS (US)

(73) Assignee: Semisouth Laboratories, Inc., Starkville, MS (US)

( * ) Notice: Subject to any disclaimer, the term of this patent is extended or adjusted under 35 U.S.C. 154(b) by 0 days.

(21) Appl. No.: 11/505,813

(22) Filed: Aug. 18, 2006

(65) Prior Publication Data
US 2007/0012946 A1   Jan. 18, 2007

Related U.S. Application Data

(62) Division of application No. 10/999,954, filed on Dec. 1, 2004, now Pat. No. 7,119,380.

(51) Int. Cl.
*H01L 21/8234* (2006.01)
*H01L 21/336* (2006.01)
*H01L 29/78* (2006.01)

(52) U.S. Cl. .............. 257/263; 257/280; 257/329; 257/E29.257; 257/E21.421; 257/E21.629; 257/135; 438/136; 438/137

(58) Field of Classification Search ............. None
See application file for complete search history.

(56) References Cited

U.S. PATENT DOCUMENTS 3,767,946 A    10/1973  Berger et al. .............. 307/304
4,107,725 A     8/1978  Yoshida et al. ............. 357/41
4,587,712 A     5/1986  Baliga .......................... 29/571
4,663,547 A     5/1987  Baliga et al. ................ 307/570
4,945,394 A *   7/1990  Palmour et al. ............... 257/77
5,264,713 A    11/1993  Palmour ....................... 257/77
5,345,097 A *   9/1994  Nakagawa .................. 257/198
5,391,895 A *   2/1995  Dreifus ........................ 257/77

(Continued)

OTHER PUBLICATIONS

Xie, et al. "Monolithic NMOS Digital Integrated Circuits in 6H-SiC," *IEEE Electron Device Letters*, vol. 15, No. 11, Nov. 1994, pp. 455-457.
Brown, et al. "High Temperature Silicon Carbide Planar IC Technology And First Monolithic Sic Operational Amplifier IC," *Transactions of 2nd Int. High-Temp. Elec. Conf.* (HiTEC), 1994, pp. XI-17-XI-22.

(Continued)

*Primary Examiner*—Evan Pert
*Assistant Examiner*—Victor A. Mandala, Jr.
(74) *Attorney, Agent, or Firm*—Merchant & Gould, P.C.; Christopher W. Raimund

(57) ABSTRACT

A junction field effect transistor is described. The transistor is made from a wide bandgap semiconductor material. The device comprises source, channel, drift and drain semiconductor layers, as well as p-type implanted or Schottky gate regions. The source, channel, drift and drain layers can be epitaxially grown. The ohmic contacts to the source, gate, and drain regions can be formed on the same side of the wafer. The devices can have different threshold voltages depending on the vertical channel width and can be implemented for both depletion and enhanced modes of operation for the same channel doping. The devices can be used for digital, analog, and monolithic microwave integrated circuits. Methods for making the transistors and integrated circuits comprising the devices are also described.

15 Claims, 8 Drawing Sheets

U.S. PATENT DOCUMENTS

| | | | | |
|---|---|---|---|---|
| 5,610,085 | A | 3/1997 | Yuan et al. | 437/29 |
| 5,710,455 | A | 1/1998 | Bhatnagar et al. | 257/472 |
| 5,798,539 | A * | 8/1998 | Jorke | 257/197 |
| 5,945,701 | A | 8/1999 | Siergiej et al. | 257/285 |
| 6,156,611 | A | 12/2000 | Lan et al. | 438/268 |
| 6,344,663 | B1 | 2/2002 | Slater, Jr. et al. | 257/77 |
| 6,503,782 | B2 | 1/2003 | Casady et al. | 438/135 |
| 6,545,297 | B1 * | 4/2003 | Noble et al. | 257/124 |
| 6,600,192 | B1 | 7/2003 | Sugawara et al. | 257/329 |
| 6,693,322 | B2 | 2/2004 | Friedrichs et al. | 257/330 |
| 6,841,812 | B2 | 1/2005 | Zhao | 257/256 |
| 6,943,407 | B2 * | 9/2005 | Ouyang et al. | 257/329 |
| 6,958,275 | B2 * | 10/2005 | Metzler | 438/270 |
| 7,009,209 | B2 | 3/2006 | Casady et al. | 29/571 |
| 2005/0067630 | A1 * | 3/2005 | Zhao | 257/134 |
| 2006/0113593 | A1 * | 6/2006 | Sankin et al. | 257/341 |

OTHER PUBLICATIONS

Agarwal, et al. "Investigation of Lateral RESURF, 6H-SiC MOSFETS," *Material Science Forum*, vol. 338-342 (2000), pp. 1307-1310.

Agarwal, et al. "A Critical Look at the Performance Advantages and Limitations of 4H-SiC power UMOSFET Structures," *Proceedings of 8th International Symposium on Power Semiconductor Devices and ICs*, May 23, 1996, pp. 119-122.

Agarwal, et al. "Temperature Dependence of Fowler-Nordheim Current in 6H- and 4H-SiC MOS Capacitors," *IEEE Electron Device Letters*, vol. 18, Issue 12, Dec. 1997, pp. 592-594.

Sheppard, et al. "High Power Hybrid and MMIC Amplifiers Using Wide-Bandgap Semiconductor Devices on Semi-Insulating SiC Substrates," Digest of 60th Device Research Conference, Jun. 24-26, 2002, pp. 175-178.

Lam et al., "Ion Implant Technology for 6H-SiC MESFETs Digital ICs," Digest of 54th Annual Device Research Conference, Jun. 24-26, 1996, pp. 158-159.

Neudeck, et al. "600° C. Logic Gates Using Silicon Carbide JFET'S," *Government Microcircuit Applications Conference* cosponsored by DOD, NASA, DOC, DOE, NSA, and CIA Anaheim, California, Mar. 20-24, 2000.

Merrett, et al. "Silicon Carbide Vertical Junction Field Effect Transistors Operated At Junction Temperatures Exceeding 300° C.," *Proceedings of IMAPS International Conference and Exhibition on High Temperature Electronics (HITECH 2004)*, May 17-20, 2004, Santa Fe, NM.

Asano, et al. "5.5kV Normally-off Low RonS 4H-SiC SEJFET," Proceedings of 2001 International Symposium on Power Semiconductor Devices & ICs, Osaka, 2001, pp. 23-26.

Li et al. "Design of 1.7 to 14kV Normally-Off Trenched and Implanted Vertical JFET in 4H-SiC" Materials Science Forum, vols. 457-460 (2004) pp. 1197-1200.

Sankin et al. "On Development of 6H-SiC LDMOS Transistors Using Silane-ambient Implant Anneal" *Solid-State Electronics*, Mar. 13, 2001.

Friedrichs et al. "SiC Power Devices With Low On-Resistance for Fast Switching Application" *ISPSO*, May 22-25, 2000.

Sankin, et al, "Normally-Off Integrated JFET Power Switches in Wide Bandgap Semiconductors and Methods of Making" related pending U.S. Appl. No. 11/000,222, filed on Dec. 1, 2004.

* cited by examiner

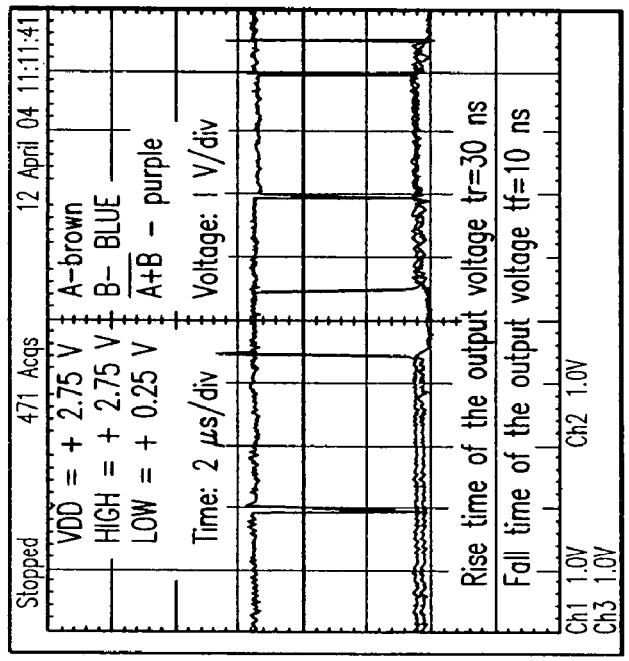
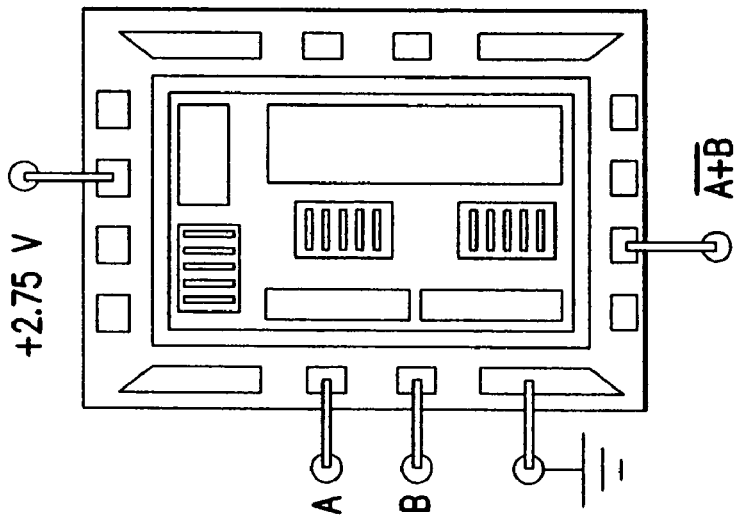
FIG.8A  FIG.8B  FIG.8C

LATERAL TRENCH FIELD-EFFECT TRANSISTORS IN WIDE BANDGAP SEMICONDUCTOR MATERIALS, METHODS OF MAKING, AND INTEGRATED CIRCUITS INCORPORATING THE TRANSISTORS

CROSS REFERENCE TO RELATED CASES

This application is a divisional of U.S. patent application Ser. No. 10/999,954, filed Dec. 1, 2004 now U.S. Pat. No. 7,119,380. This application is related to U.S. patent application No. 60/585,881, filed Jul. 8, 2004, and U.S. patent application Ser. No. 11/000,222, filed on Dec. 1, 2004, entitled: "Normally-Off Integrated JFET Power Switches In Wide Bandgap Semiconductors And Methods Of Making." Each of the aforementioned applications is incorporated by reference herein in its entirety.

BACKGROUND

1. Technical Field

The present invention relates generally to lateral field effect transistors (FETS) with vertical channels, and in particular, to such transistors formed in wide bandgap semiconductor materials. This invention also relates to monolithic integrated circuits comprising these transistors.

2. Background of the Technology

Wide bandgap semiconductor materials (with $E_G$>2 eV) such as silicon carbide (SiC) or Group III nitride compound semiconductors (e.g., gallium nitride GaN) are very attractive for use in high-power, high-temperature, and/or radiation resistant electronics. SiC power rectifiers and RF transistors are now commercially available, and SiC power switches as well as GaN microwave transistors are expected to appear in the commercial market in the near future.

Because of the fundamental differences in material properties and processing technologies, traditional Si or GaAs integrated circuit (IC) technologies such as Complementary Metal-Oxide-Semiconductor (CMOS) or Direct Coupled FET Logic (DCFL) cannot in most cases be easily transferred to wide bandgap semiconductor industry. Several attempts at fabricating SiC NMOS and CMOS digital and analog ICs have been reported in the last decade (e.g., [1], [2]). A monolithic CMOS integrated device in SiC and method of fabricating the same have been patented in 2002 [3]. Moreover, recent development of SiC Lateral DMOS Field-Effect Transistors (LDMOSFETs) (e.g., [4], [5]) theoretically allows for the monolithic integration of MOSFET-based control circuitry and power switch for use in Smart Power electronics. However, certain issues limit the use of MOSFET-based SiC integrated circuits in the applications where high temperature and/or radiation tolerance is required. The first such issue is on-state insulator reliability due to much smaller conduction band offset of SiC to $SiO_2$ as compared to that of silicon [6], [7]. This issue becomes even more significant at high temperature and extreme radiation environment. Other issues include: low inversion channel mobility due to high interface state density at the $SiC/SiO_2$ interface and high fixed charge density in the insulator; and significant threshold voltage shift with temperature due to ionization of interface states.

Another transistor candidate for the use in SiC ICs is a Metal Semiconductor Field-Effect Transistor (MESFET). Although SiC MESFET monolithic microwave integrated circuits (MMICS) have received significant attention in the last decade (e.g., [8]), there have been few published attempts to build SiC MESFET logic and analog circuits (e.g., [9]).

An alternative to the MOSFET and MESFET approaches is the use of lateral JFET-based ICs. An example of a vertical channel JFET employing a recessed gate structure can be found in U.S. Pat. No. 4,587,712 [10]. An example of a lateral JFET formed in SiC can be found in U.S. Pat. No. 5,264,713 [11]. Enhanced-mode JFET digital ICs with resistive load have also been reported [12]. JFET based ICs can also be implemented in either complementary (n-type and p-type channels as disclosed in U.S. Pat. No. 6,503,782 [13] or enhanced-depletion (n-type channels) forms. SiC JFETs have proven to be radiation tolerant while demonstrating very insignificant threshold voltage shift with temperature [14]. A major deficiency of this approach has been difficulties achieving monolithic integration of low voltage control circuitry with power switches for Smart Power electronics.

SUMMARY

According to a first embodiment, a junction field-effect transistor is provided which comprises:

a substrate having opposed first and second major surfaces;

a drain layer of an n-type semiconductor material on the first major surface of the substrate;

a drift layer of an n-type semiconductor material on and non-coextensive with the drain layer such that portions of the drain layer are exposed, the drift layer having a lower conductivity than the drain layer;

one or more discrete raised regions in spaced relation on the drain layer, each of the raised regions comprising a channel region of an n-type semiconductor material on the drift layer and a source region of an n-type semiconductor material on the channel region, the material of the source region having a higher conductivity than that of the channel region;

a gate region of a p-type semiconductor material on the drift layer adjacent the one or more raised regions and forming a rectifying junction with n-type material of the drift layer and the channel region(s);

ohmic contacts on the gate and source regions and on exposed portions of the drain layer.

According to this embodiment, the source region can be coextensive with the channel region.

According to a second embodiment, a semiconductor device is provided which comprises:

a substrate having opposed first and second major surfaces; and a first and a second junction field-effect transistor each on a discrete location on the first major surface of the substrate, each of the junction field-effect transistors comprising:

a drain layer of an n-type semiconductor material on and non-coextensive with the first surface of the substrate such that portions of the substrate surrounding the drain layer are exposed;

a drift layer of an n-type semiconductor material on and non-coextensive with the drain layer such that portions of the drain layer are exposed, the drift layer having a lower conductivity than the drain layer;

one or more discrete raised regions in spaced relation on the drift layer, each of the raised regions comprising a channel region of an n-type semiconductor material on the drift layer and a source region of an n-type semiconductor material on the channel region, the material of the source region having a higher conductivity than that of the channel region;

a gate region of a p-type semiconductor material on the drift layer adjacent the one or more raised regions and forming a rectifying junction with n-type material of the drift layer and the channel region(s);

ohmic contacts on the gate and source regions and on exposed portions of the drain layer.

The first junction field-effect transistor can have a first threshold voltage and the second junction field-effect transistor can have a second threshold voltage different than the first threshold voltage.

According to a third embodiment, a field-effect transistor is provided which comprises:

a substrate having opposed first and second major surfaces;

a drain layer of an n-type semiconductor material on the first major surface of the substrate;

a drift layer of an n-type semiconductor material on the drain layer and non-coextensive therewith such that portions of the drain layer are exposed, the drift layer having a lower conductivity than the drain layer;

one or more discrete raised regions in spaced relation on the drift layer, each of the raised regions comprising a channel region of an n-type semiconductor material on the drift layer and a source region of an n-type semiconductor material on the channel region, the n-type semiconductor material of the source region having a higher conductivity than that of the channel region;

a metal layer on the drift layer adjacent the one or more raised regions and forming a metal-semiconductor rectifying junction with the drift layer and the channel region(s); and ohmic contacts on the source region and on exposed surfaces of the drain layer. According to this embodiment, the source region can be coextensive with the channel region.

The field-effect transistor according to any of the aforementioned embodiments can comprise a plurality of raised regions. The raised regions can be elongate, having a major and a minor dimension. The raised regions can be oriented such that the major dimensions of the raised regions are parallel to one another. The plurality of raised source regions can also be spaced apart from one another at regular intervals in the direction of the minor dimension. The gate region can comprise a plurality of fingers extending between adjacent raised regions.

According to a fourth embodiment, a field-effect transistor is provided which comprises:

a substrate having opposed first and second major surfaces;

a drain layer of an n-type semiconductor material on the first major surface of the substrate; and a drift layer of an n-type semiconductor material on the drain layer and non-coextensive therewith such that portions of the drain layer are exposed, the drift layer having a lower conductivity than the drain layer;

a gate region of a p-type semiconductor material formed in the drift layer;

a channel region of an n-type semiconductor material on the drift layer and forming a rectifying junction with the gate region; and a source region of an n-type semiconductor material on the channel region, the semiconductor material of the source region having a higher conductivity than that of the channel region; and ohmic contacts on the source region and on exposed portions of the drain layer. According to this embodiment, the source, channel and drift regions can be coextensive. In addition, the gate region can comprise a plurality of fingers.

In the field-effect transistor according to any of the aforementioned embodiments, the semiconductor material of the drain layer, drift layer, gate region, channel region and source region can have an $E_G$ of at least 2 eV (e.g., SiC or a Group III nitride compound semiconductor material such as GaN).

In the field-effect transistor according to any of the aforementioned embodiments, the substrate can be selected from the group consisting of: semi-insulating; p-type; or n-type with a p-type buffer layer thereon wherein the p-type buffer layer forms the first surface of the substrate.

According to a further embodiment, an integrated circuit which comprises a plurality of field-effect transistors as set forth in any of the aforementioned embodiments disposed on a common substrate is provided. The integrated circuit can comprise a first field-effect transistor having a first threshold voltage and a second field-effect transistor having a second threshold voltage different than the first threshold voltage.

According to a further embodiment, a method of making a field-effect transistor is provided which comprises selectively etching a multi-layered structure. According to this embodiment, the multi-layered structure comprises: a substrate having opposed first and second surfaces; a drain layer of an n-type semiconductor material on the first surface of the substrate; a drift layer of an n-type semiconductor material non the drain layer, the drift layer having a lower conductivity than the drain layer; a channel layer of an n-type semiconductor material on the drift layer between and in contact with adjacent gate regions; and a source layer of an n-type semiconductor material on the channel region, the source layer having a higher conductivity than the channel layer. The method according to this embodiment comprises selectively etching through the source layer and partially through the channel layer to form at least one raised region; selectively implanting ions of a p-type dopant in exposed portions of the channel layer adjacent the at least one raised region; selectively etching through exposed portions of the implanted channel layer and underlying drift layer to expose underlying drain layer; and selectively etching through exposed portions of the drain layer to expose underlying substrate thereby forming an etched structure.

According to a further embodiment, a method of making a field-effect transistor is provided which comprises selectively implanting a p-type dopant on a multi-layered structure. According to this embodiment, the multi-layered structure comprises: a substrate having opposed first and second major surfaces; a drain layer of an n-type semiconductor material on the first major surface of the substrate; a drift layer of an n-type semiconductor material on the drain layer, the drift layer having a lower conductivity than the drain layer. The method according to this embodiment comprises selectively implanting the p-type dopant in the drift layer to form a gate region; depositing or growing a channel layer of an n-type semiconductor material on the implanted surface of the drift layer; depositing or growing a source layer of an n-type semiconductor material on the channel layer, the source layer having a higher conductivity than the channel layer; selectively etching through the source layer, the channel layer and the implanted drift layer to expose underlying drain layer thereby forming raised regions; and selectively etching through portions of the exposed drain layer to expose underlying substrate thereby forming an etched structure.

According to a further embodiment, a method of making a field-effect transistor is provided which comprises selectively etching a multi-layered structure. According to this embodiment, the multi-layered structure comprises: a substrate having opposed first and second major surfaces; a drain layer of an n-type semiconductor material on the first major surface of the substrate; a drift layer of an n-type semiconductor material on the drain layer, the drift layer having a lower conductivity than the drain layer; a channel layer of an n-type semiconductor material on the drift layer; and a source layer of an n-type semiconductor material on the channel region, the source layer having a higher conductivity than the channel layer. The method according to this embodiment comprises selectively etching through the source and channel layers to expose underlying drift layer thereby forming at least one raised region; selectively etching through exposed portions of the drift layer to expose underlying drain layer; selectively etching through exposed portions of the drain layer to expose underlying substrate, thereby forming an etched structure; and depositing a Schottky metal in contact with exposed portions of the drift layer.

A method according to any of the aforementioned embodiments may further comprise an annealing treatment after the implantation of the p-type dopant in order to activate the dopant.

A method according to any of the aforementioned embodiments may further comprise growing or depositing a layer of dielectric material on exposed surfaces of the etched structure; anisotropically etching the dielectric material to expose underlying portions of drain, gate and/or source regions parallel to the first surface of the substrate; and depositing metal on exposed portions of drain, gate and source regions.

In a method according to any of the aforementioned embodiments, the semiconductor material can be SiC. When the semiconductor material is SiC, the method can further comprise annealing after depositing metal on exposed portions of drain, gate and/or source regions such that metal at the metal/semiconductor material interface reacts to form metal silicide; and removing unreacted metal. The unreacted metal can be removed using an acid etch.

In a method according to any of the aforementioned embodiments, a plurality of raised regions can be formed. The plurality of raised regions can be elongate and can have a major and a minor dimension. The raised regions can be oriented such that the major dimensions of the raised source regions are parallel to one another. The plurality of raised source regions can be spaced apart from one another at regular intervals in the direction of the minor dimension.

In a method according to any of the aforementioned embodiments, multiple etched structures can be formed on a single substrate wherein etching through the drain layer isolates each etched structure.

BRIEF DESCRIPTION OF THE FIGURES

FIGS. 8A–8C shows a photograph (FIG. 8A), measured waveforms (FIG. 8B), and logical performance (FIG. 8C) of a hybrid logic NOR-gate built on an alumina substrate using discrete vertical channel power VJFETS.

REFERENCE NUMERALS

Figure 1:
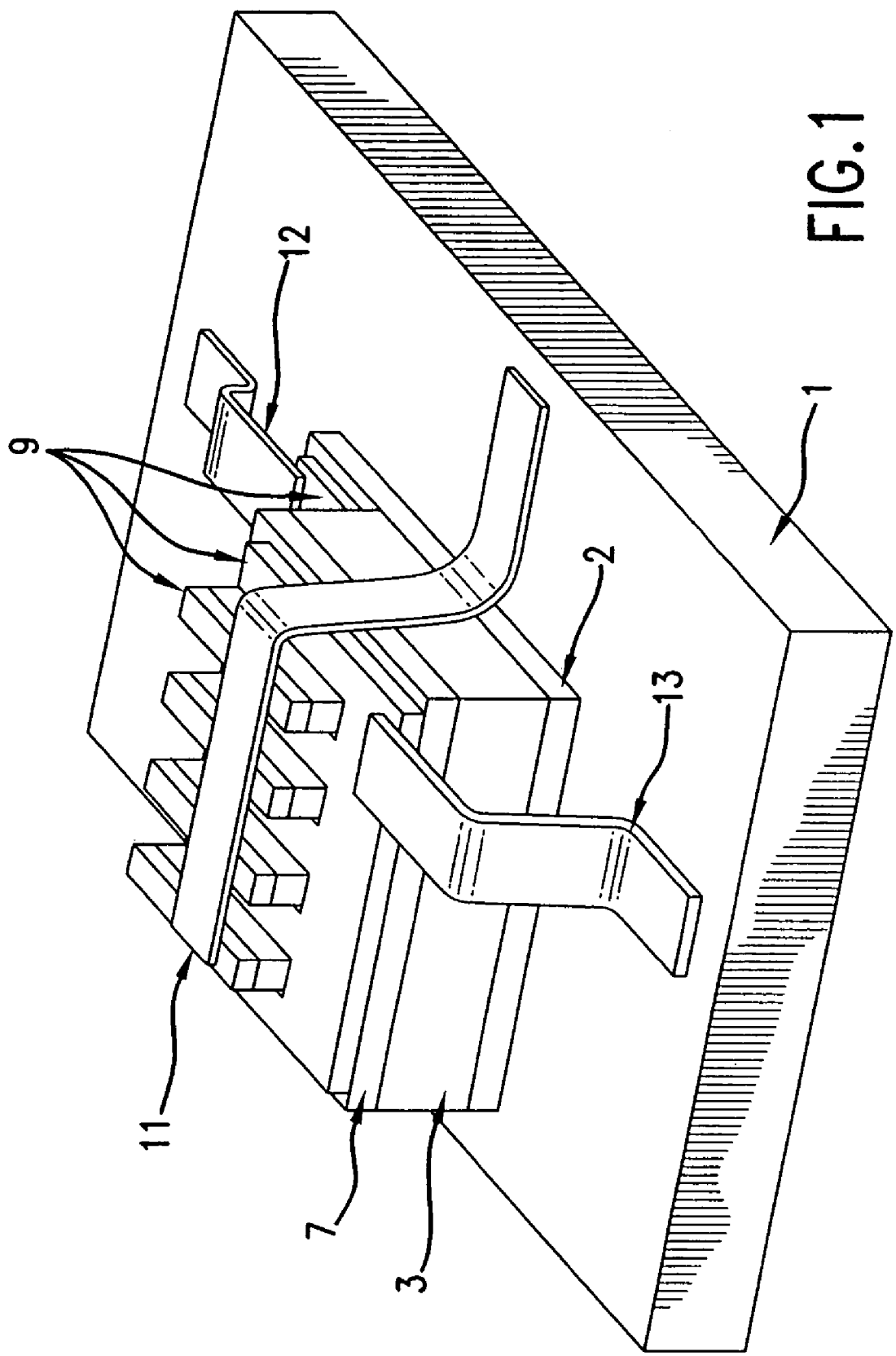
FIG. 1 is a schematic three-dimensional illustration of a multi-finger Lateral Trench JFET.

The reference numerals used in the drawings are defined as set forth below.
1. Substrate
2. N-type drain layer (e.g., N++)
3. N-type drift region
4. N-type channel layer
5. N-type source layer (e.g., N++)
6. Etch/Implantation mask
7. Implanted P+ gate regions
8. Dielectric
9. Ohmic contacts
10. P-type buffer layer
11. Source interconnect
12. Drain interconnect
13. Gate interconnect

DETAILED DESCRIPTION

A vertical channel Junction Field-Effect Transistor (JFET) which can be made electrically isolated from other devices fabricated on the same die and that can be implemented in such a way that the devices fabricated on the same die can have different threshold voltages is provided. Monolithic integrated circuits comprising the above device and methods of fabricating the device and integrated circuits comprising the device are also provided.

The present invention relates generally to Junction Field-Effect Transistors (JFETs) with vertical channel and monolithic integrated circuits fabricated using such devices. In particular, the present invention relates to such transistors and circuits formed in wide bandgap semiconductor materials.

The present device can be built on a wide bandgap (i.e., $E_G>2$ eV) semiconductor substrate, which can be either semi-insulating, p-type, or n-type with a p-type buffer layer. The device can comprise source, channel, drift and drain epitaxially grown n-type layers, as well as p-type implanted gate regions. The device structure can be defined using plasma etch and ion implantation, and the ohmic contacts to the source, gate, and drain regions can be formed on the same side of the wafer.

Depending on the vertical channel width, the JFET may have different threshold voltages, and can be implemented for both depletion and enhanced modes of operation for the same channel doping. Fabricated on the same wafer or die, the devices with different threshold voltages can be used for both digital and analog integrated circuits. In addition, the devices described above can be used in monolithic microwave integrated circuits (MMICs).

The present invention will be described in more detail hereafter with reference to the accompanying drawings and photographs, in which preferred embodiments of the invention are described with silicon carbide (SiC) semiconductor serving as an example. Silicon carbide crystallizes in numerous (i.e., more than 200) different modifications (polytypes). The most important polytypes are: 3C—SiC (cubic unit cell, zincblende); 2H—SiC; 4H—SiC; 6H—SiC (hexagonal unit cell, wurtzile); 15R—SiC (rhombohedral unit cell). The 4H polytype is more attractive for power devices, however, because of its higher electron mobility. Although the 4H—SiC is preferred, it is to be understood that the present invention is applicable to devices and integrated circuits described herein made of other wide bandgap semiconductor materials such as gallium nitride, and other polytypes of silicon carbide, by way of example.

Referring to FIG. 1, an example schematic 3-dimensional view is shown of semiconductor device referred to as Lateral Trench Junction Field-Effect Transistor (LTJFET). The described device is built on the wide bandgap semiconductor substrate (1), which can be either semi-insulating, p-type, or n-type with p-type buffer layer. As shown in FIG. 1, the device comprises source, channel, drift (3) and drain (2) epitaxially grown n-type layers, as well as p-type implanted gate regions (7). The device structure shown in FIG. 1 is defined using plasma etch and ion implantation, and the ohmic contacts (9) to the source, gate, and drain regions are formed on the same side of the wafer. Source (11), drain (12) and gate (13) interconnects are also shown in FIG. 1.

Figure 2:
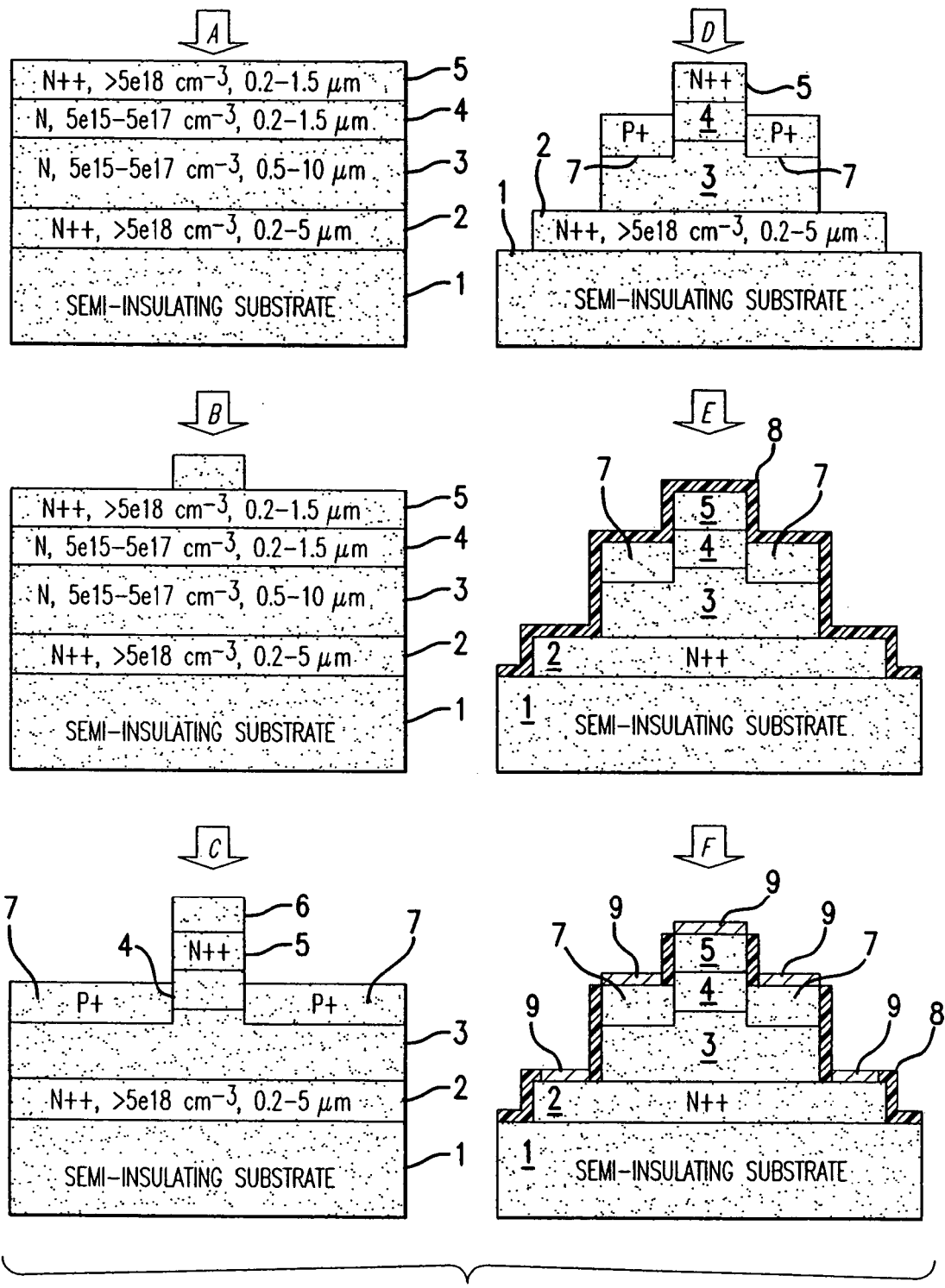
FIG. 2 is a schematic diagram illustrating the fabrication process of a single-finger Lateral Trench JFET.

FIG. 2 is a schematic representing an exemplary fabrication method for a single-finger LTJFET built on a semi-insulating substrate. As shown in FIG. 2, an epitaxial stack is grown on a semi-insulating substrate in fabrication step A. In fabrication step B, an etch/implantation mask (6) is formed on the surface of the top epitaxial layer. In step C, the source and the channel regions are defined by sequential plasma etch steps through layer (5) and partially through layer (4), followed by implantation of $Al^+$ or $B^+$ ions to form p-type gate regions (7). After a high-temperature post-implantation anneal, in fabrication step D, sequential plasma etch steps are used to expose heavily doped drain layer (2) by etching through the gate region (7) and drift layer (3), and to form mesa isolation by etching through layer (2) into semi-insulating substrate (1). In step E, a thin layer of dielectric (8) is either grown or deposited on the surface that has resulted from the previous fabrication steps. An anisotropic plasma etch is then performed in fabrication step F to expose semiconductor material on the horizontal areas of the device by etching through the thin dielectric layer. This etch step can be followed by metal deposition and high temperature ohmic contact anneal to form metal silicide in the areas where metal touches semiconductor material. After the silicide formation, the unreacted metal can removed (e.g., using acid etch).

Figure 3A:
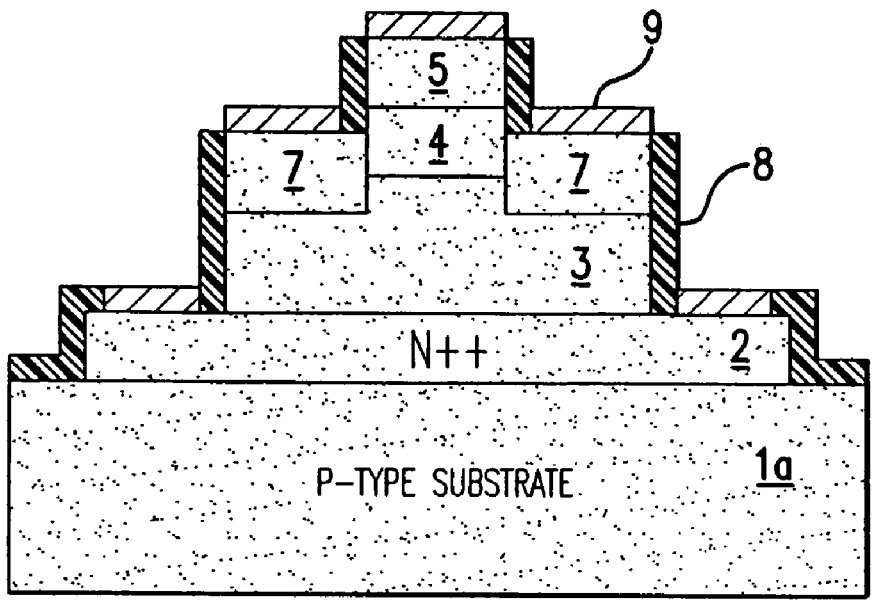
FIG. 3A is a schematic cross-section of a single-finger Lateral Trench JFET fabricated on p-type substrate.
Figure 3B:
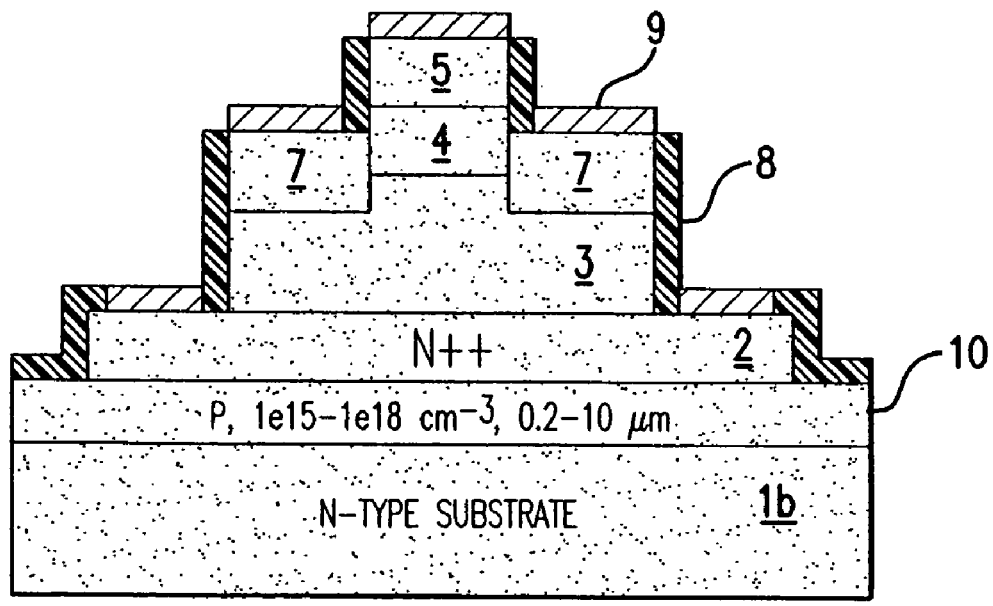
FIG. 3B is a schematic cross-section of a single-finger Lateral Trench JFET fabricated on n-type substrate with p-type buffer layer.

FIGS. 3A and 3B are schematic cross-sectional representations of LTJFETs fabricated on conducting substrates and isolated from the other devices fabricated on the same die by a p-n junction. FIG. 3A shows a schematic cross-section of a single-finger LTJFET fabricated on p-type substrate using the fabrication process presented in FIG. 2. As shown in FIG. 3B, the LTJFET can also be fabricated on an n-type substrate. As shown in FIG. 3B, this device comprises an additional p-type epitaxially grown layer to provide p-n junction isolation.

Although exemplary embodiments are shown in FIGS. 1, 2, 3A and 3B, other alternatives to the present invention are possible. For example, GaN n-type epitaxial layers can be grown on silicon carbide, sapphire, or silicon substrates to form a starting material stack for the fabrication of the device structure. Alternatively, a substrate material comprising a conducting SiC substrate with semi-insulating epitaxially grown buffer layer can be used. Such a device is described in U.S. patent application Ser. No. 10/033,785, filed Jan. 3, 2002, published as U.S. Patent Publication No. 2002-0149021 [15], which application is incorporated by reference herein in its entirety.

Alternatively, different types of ceramics with high thermal conductivity can be used as a substrate material (e.g., AlN, $Al_2O_3$, BeO, etc.).

Figure 4A:
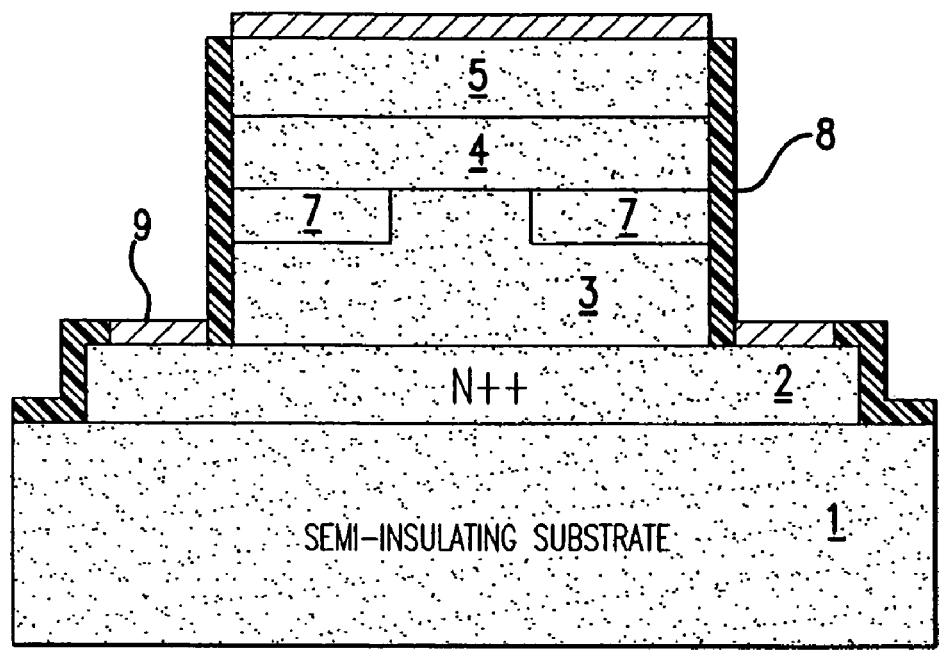
FIG. 4A is a schematic cross-section of a single-channel Lateral JFET with overgrown source region
Figure 4B:
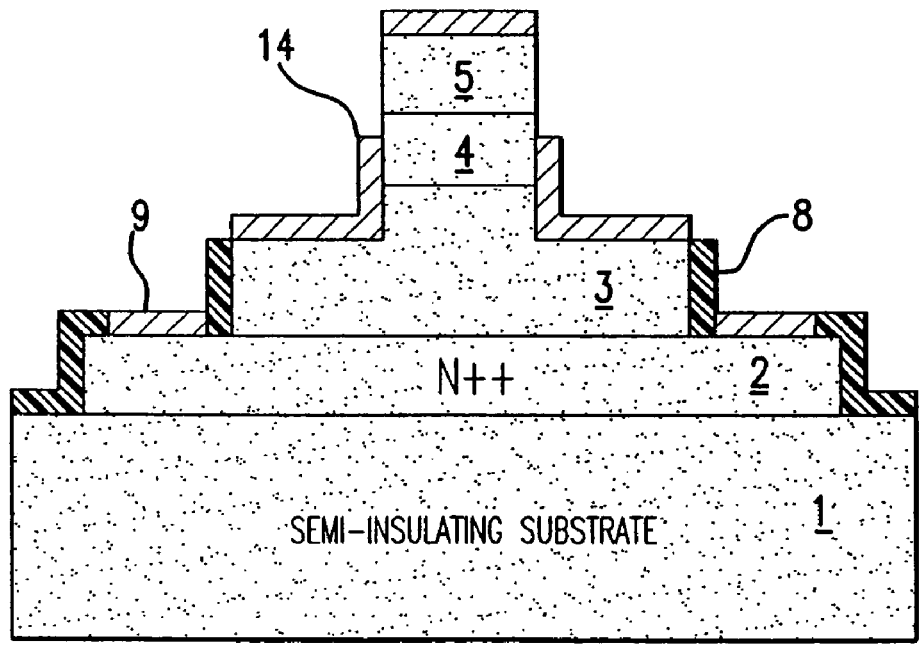
FIG. 4B is a schematic cross-section of a single-finger Lateral Trench FET with Schottky gate.

Although a JFET structure where the channel is formed with recessed ion-implanted gates is described above, it is also possible to use field-effect transistors (FETs) with different channel structure. FIGS. 4A and 4B are schematic cross-sections of FETs fabricated on semi-insulating substrates with alternative structures for the vertical channel. FIG. 4A shows a schematic cross-section of a single-channel JFET, where the channel region is defined by p-type implantation followed by epitaxial growth of n-type layers. Examples of how to form an overgrown source region in a vertical JFET structure can be found in U.S. Pat. No. 5,610,085 [16].

As shown in FIG. 4B, a lateral trench FET can also be fabricated implementing a Schottky gate instead of an ion-implanted p-type gate. Examples of how to form a Schottky gate in a trench structure can be found in U.S. Pat. Nos. 6,156,611 and 5,945,701 [17], [18].

Figure 5A:
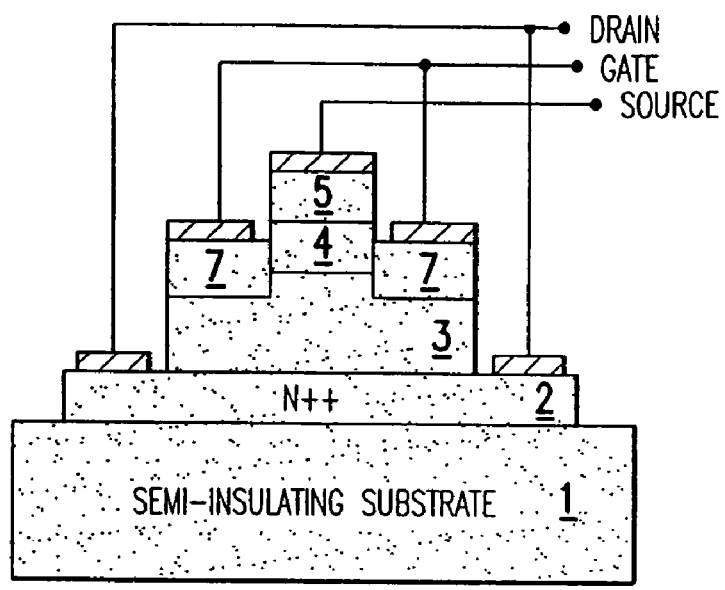
FIG. 5A is a schematic cross-section of a single-finger Lateral Trench JFET fabricated on semi-insulating substrate, and schematic presentation of electrical connections.
Figure 5B:
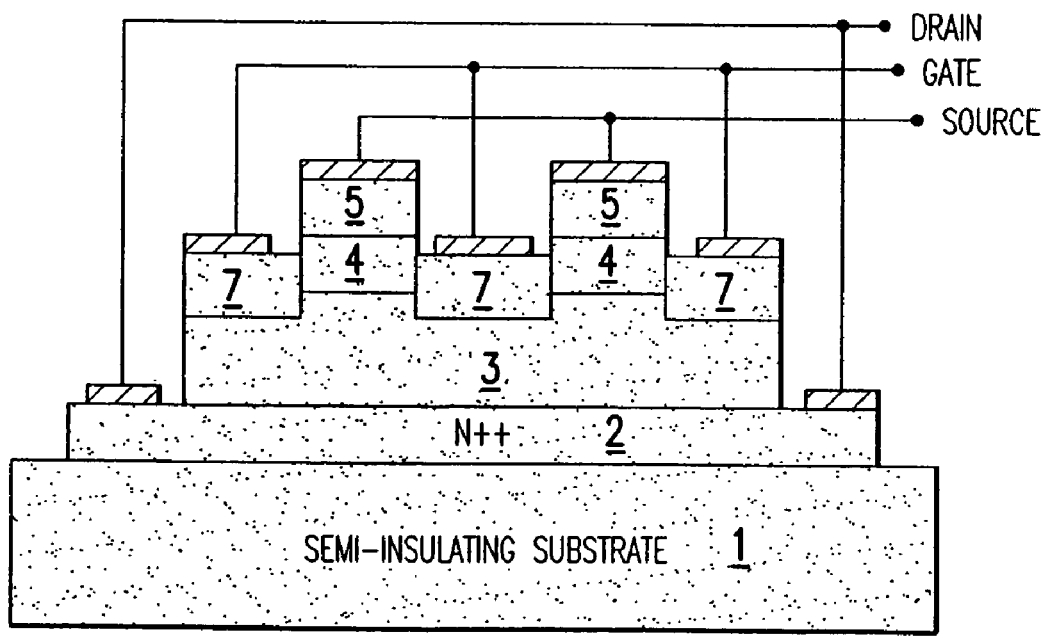
FIG. 5B is a schematic cross-section of a multi-finger Lateral Trench JFET fabricated on semi-insulating substrate, and schematic presentation of electrical connections.

FIGS. 5A and 5B are schematic cross-sectional representations of single-finger and multi-finger Lateral Trench JFETs fabricated on a semi-insulating substrate including schematic depictions of electrical connections to the source, drain, and gate terminals.

As set forth above, LTJFETs fabricated on the same die may have vertical channels of different widths (i.e., widths of source fingers) that would result in different threshold voltages. The possibility to define device threshold voltage by layout design provides an additional flexibility for the design of monolithic integrated circuits. For example, having multiple threshold voltages on the same chip enables more flexibility and higher integrity for RF designs. Such flexibility can be very difficult to achieve, for example, in the case of devices with lateral channels such as MOSFETs or lateral JFETs.

Figure 6A:
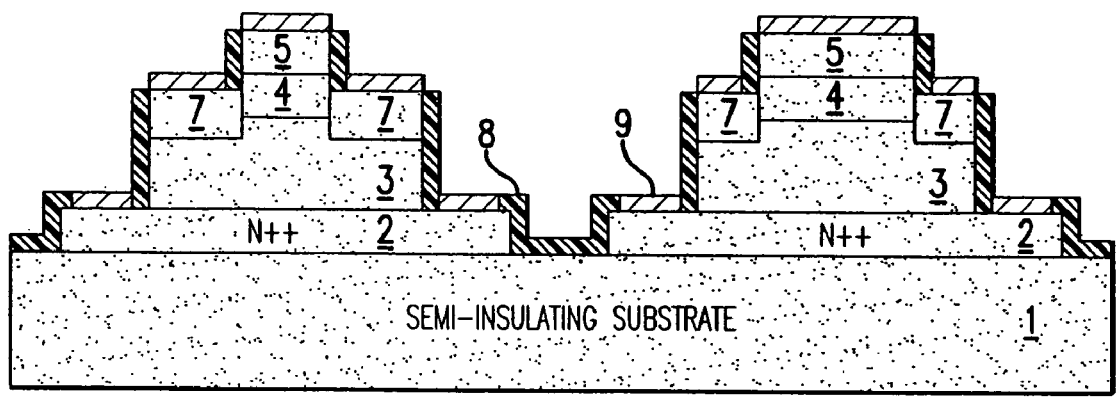
FIG. 6A is a schematic cross-section of two single-finger Lateral Trench JFETs with different threshold voltages fabricated on the same die.
Figure 6B:
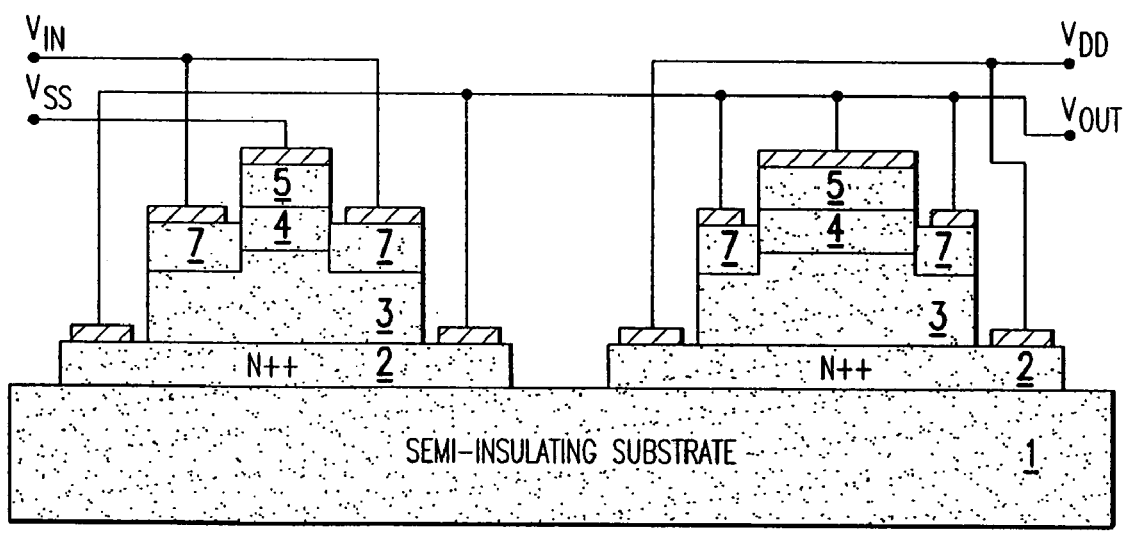
FIG. 6B is a schematic cross-section of two single-finger Lateral Trench JFETs with different threshold voltages fabricated on the same die including electrical connections used to form a monolithic inverter circuit.

In particular, the presented devices fabricated on the same die can be implemented for both enhanced and depletion modes of operation by choosing proper widths of the source fingers. FIG. 6A provides a schematic cross-section of two single-finger Lateral Trench JFETs fabricated on the same die with different vertical channel widths. FIG. 6B is a schematic showing a monolithic inverter circuit using the devices depicted in FIG. 6A.

Figure 7A:
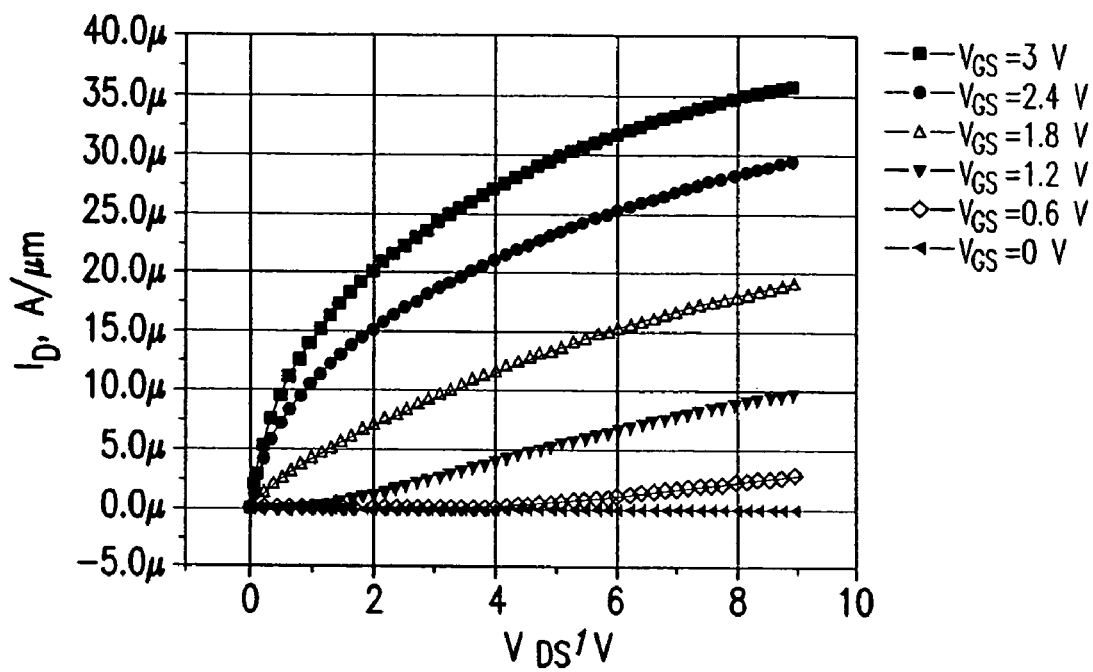
FIG. 7A displays the measured I–V characteristics of a discrete vertical channel power VJFET implemented for enhanced mode operation wherein the values of the drain current shown are normalized to 1 μm of the gate periphery.
Figure 7B:
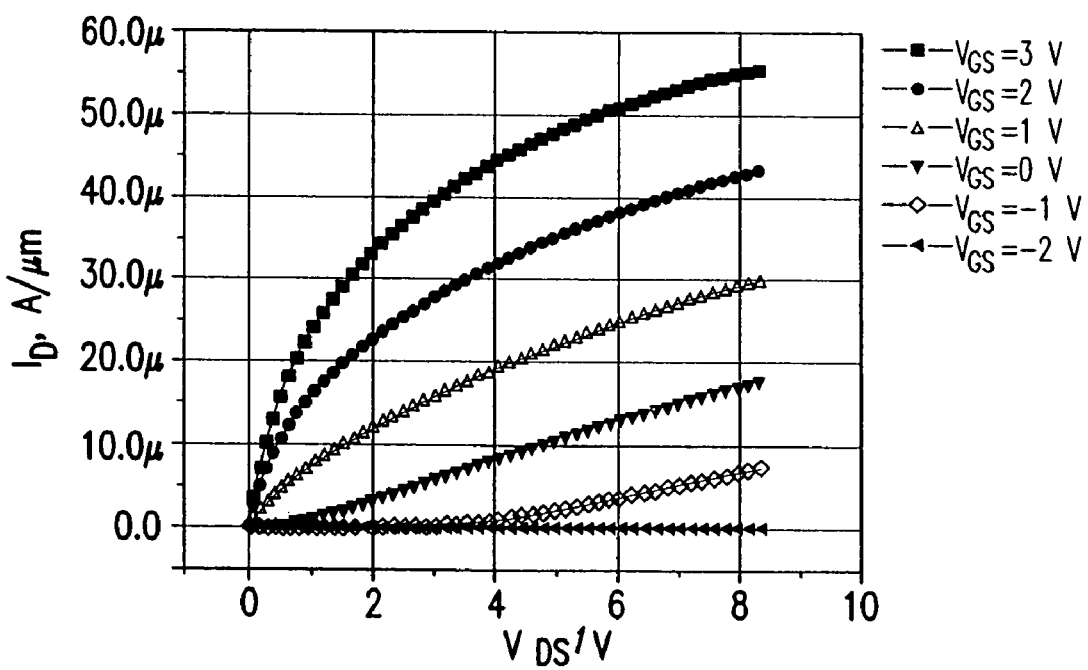
FIG. 7B displays the measured I–V characteristics of a discrete vertical channel power VJFET implemented for depletion mode operation wherein the values of the drain current shown are normalized to 1 μm of the gate periphery.

The feasibility of fabricating integrated circuits using Lateral Trench JFETs has been shown using discrete power vertical channel VJFETs fabricated on the same wafer and implemented for both enhanced and depletion modes of operation. Drain I-V characteristics measured on discrete vertical channel power VJFETs and normalized to the unit length of the gate periphery are shown in FIGS. 7A and 7B. A hybrid logic NOR-gate built on an alumina substrate using these devices, as well as the measured waveforms and logic performance of this device are shown in FIGS. 8A, 8B and 8C.

The SiC layers can be formed by doping the layers with donor or acceptor materials using known techniques. Exemplary donor materials include nitrogen and phosphorus. Nitrogen is a preferred donor material. Exemplary acceptor materials for doping SiC include boron and aluminum. Aluminum is a preferred acceptor material. The above materials are merely exemplary, however, and any acceptor and donor materials which can be doped into silicon carbide can be used. The dop bing levels and thicknesses of the various layers of the Lateral Trench JFET described herein can be varied to produce a device having desired characteristics for a particular application. Similarly, the dimensions of the various features of the device can also be varied to produce a device having desired characteristics for a particular application.

The SiC layers can be formed by epitaxial growth on a suitable substrate. The layers can be doped during epitaxial growth.

Unless otherwise indicated, heavily doped (++) in the context of the invention corresponds to dopant concentrations of $10^{18}$ atoms·cm$^{-3}$ or greater, lightly doped (−) corresponds to dopant concentrations of $5 \times 10^{16}$ atoms~cm$^{-3}$ or less and moderately doped (+) corresponds to dopant concentrations of between $5 \times 10^{16}$ atoms·cm$^{-3}$ and $10^{18}$ atoms·cm$^{-3}$.

While the foregoing specifications teaches the principles of the present invention, with examples provided for the purpose of illustration, it will be appreciated by one skilled in the art from reading this disclosure that various changes in form and detail can be made without departing from the true score of the invention.

REFERENCES

1. Xie, W.; Cooper, M. R., Jr.; Melloch, M. R., "Monolithic NMOS Digital Integrated Circuits in 6H—SiC," *IEEE Electron Device Letters*, Vol. 15 No. 11, November 1994, pp. 455–457.

2. D. M. Brown et al., "High temperature silicon carbide planar IC technology and first monolithic SiC operational amplifier IC," *Transactions of 2$^{nd}$ Int. High-Temp. Elec. Conf. (HiTEC)*, 1994, pp. XI-17-XI-22.

3. Slater, Jr. et al., "Silicon Carbide CMOS devices," U.S. Pat. No. 6,344,663, Feb. 5, 2002.

4. Bhatnagar, M., Weitzel, C. E., Zunino, M., "Lateral MOSFET with modified field plates and damage areas," U.S. Pat. No. 5,710,455, Jan. 20, 1998.

5. Agarwal, A. K., Saks, N. S., Mani, S. S., Hegde, V. S., and Sanger, P. A., "Investigation of Lateral RESURF, 6H—SiC MOSFETS," *Material Science Forum*, Vol.: 338–342 (2000), pp. 1307–1310.

6. Agarwal, A. K., Siergiej, R. R., Seshadri, S., White, M. H., McMullin, P. G., Burk, A. A., Rowland, L. B., Brandt, C. D., Hopkins, R. H., "A critical look at the performance advantages and limitations of 4H—SiC power UMOSFET structures," *Proceedings of 8th International Symposium on Power Semiconductor Devices and ICs*, May 23, 1996, pp. 119–122.

7. Agarwal, A. K., Seshadri, S., Rolland, L. B., "Temperature dependence of Fowler-Nordheim current in 6H— and 4H—SiC MOS capacitors," *IEEE Electron Device Letters*, Vol. 18, Issue 12, December 1997, pp. 592–594.

8. Sheppard, S. T.; Smith, R. P.; Pribble, W. L.; Ring, Z.; Smith, T.; Allen, S. T.; Milligan, J.; Pahnour, J. W., "High power hybrid and NMIC amplifiers using wide-bandgap semiconductor devices on semi-insulating SiC substrates," Digest of 60th Device Research Conference, Jun. 24–26, 2002, pp. 175–178.

9. Lam, M. P.; Kornegay, K. T.; Cooper, J. A., Jr.; Melloch, M. R., "Ion implant technology for 6H—SiC MESFETs digital ICs," Digest of 54th Annual Device Research Conference, Jun. 24–26, 1996, Pages 158–159.

10. Baliga, B. J., "Method for making vertical channel field controlled device employing a recessed gate structure," U.S. Pat. No. 4,587,712, May 13, 1986.

11. J. W. Palmour, "Junction Field-Effect Transistor Formed in Silicon Carbide," U.S. Pat. No. 5,264,713, Nov. 23, 1993.

12. P. G. Neudeck et al., "6000C Logic Gates Using Silicon Carbide JFET's," Government Microcircuit Applications Conference cosponsored by DoD, NASA, DoC, DoE, NSA, and CIA Anaheim, California, Mar. 20–24, 2000

13. Casady, et al., "Complementary accumulation-mode JFET integrated circuit topology using wide (>2 eV) bandgap semiconductors," U.S. Pat. No. 6,503,782, Jan. 7, 2003.

14. J. N. Merrett, W. A. Draper, J. R. B. Casady, J. B. Casady, 1. Sankin, R. Kelley, V. Bondarenko, M. Mazzola, D. Seale, "Silicon Carbide Vertical Junction Field Effect Transistors Operated at Junction Temperatures Exceeding 300° C.," *Proceedings of IMAPS International Conference and Exhibition on High Temperature Electronics (HITECH 2004)*, May 17–20, 2004, Santa Fe, N. Mex.

15. Casady, et al., "Silicon carbide and related wide-bandgap transistors on semi-insulating epitaxy for high-speed, high-power applications," U.S. Patent Publication No. 2002-0149021, Oct. 17, 2002.

16. Yuan, et al., "Method of making a vertical FET using epitaxial overgrowth," U.S. Pat. No. 5,610,085, Mar. 11, 1997.

17. Lan et al., "Method of fabricating vertical FET with sidewall gate electrode," U.S. Pat. No. 6,156,611, Dec. 5, 2000.

18. Siergiej et al., "Static Induction Transistor," U.S. Pat. No. 5,945,701, Aug. 31, 1999.

What is claimed is:

1. A semiconductor device comprising:
 a substrate having opposed first and second major surfaces; and
 a first and a second junction field-effect transistor each on a discrete location on the first major surface of the substrate, each of the junction field-effect transistors comprising:
 a drain layer of an n-type semiconductor material on and non-coextensive with the first surface of the substrate such that portions of the substrate surrounding the drain layer are exposed;
 a drift layer of an n-type semiconductor material on and non-coextensive with the drain layer such that portions of the drain layer are exposed, the drift layer having a lower conductivity than the drain layer;

one or more discrete raised regions in spaced relation on the drift layer, each of the raised regions comprising a channel region of an n-type semiconductor material on the drift layer and a source region of an n-type semiconductor material on the channel region, the material of the source region having a higher conductivity than that of the channel region;

a gate region of a p-type semiconductor material on the drift layer adjacent the one or more raised regions and forming a rectifying junction with n-type material of the drift layer and the channel region(s); and ohmic contacts on the gate and source regions and on exposed portions of the drain layer.

2. The semiconductor device of claim 1, wherein the first junction field-effect transistor has a first threshold voltage and the second junction field-effect transistor has a second threshold voltage different than the first threshold voltage.

3. A method of making a junction field-effect transistor comprising:

selectively etching a multi-layered structure comprising:
a substrate having opposed first and second major surfaces;
a drain layer of an n-type semiconductor material on the first major surface of the substrate;
a drift layer of an n-type semiconductor material on the drain layer, the drift layer having a lower conductivity than the drain layer;
a channel layer of an n-type semiconductor material on the drift layer between and in contact with adjacent gate regions; and
a source layer of an n-type semiconductor material on the channel region, the source layer having a higher conductivity than the channel layer;
wherein selectively etching comprises selectively etching through the source layer and partially through the channel layer to form at least one raised source region;

selectively implanting ions of a p-type dopant in exposed portions of the channel layer adjacent the raised source region;

selectively etching through exposed portions of the implanted channel layer and underlying drift layer to expose underlying drain layer; and selectively etching through exposed portions of the drain layer to expose underlying substrate thereby forming an etched structure.

4. The method of claim 3, further comprising annealing after selectively implanting ions of a p-type dopant to activate the dopant.

5. The method of claim 3, further comprising:
growing or depositing a layer of dielectric material on exposed surfaces of the etched structure;
anisotropically etching the dielectric material to expose underlying portions of drain, gate and source regions parallel to the first surface of the substrate; and
depositing metal on exposed portions of drain, gate and source regions.

6. The method of claim 5, wherein the semiconductor material is SiC, the method further comprising:
annealing after depositing metal on exposed portions of drain, gate and source regions such that metal at metal/semiconductor material interfaces reacts to form metal silicide; and
removing unreacted metal.

7. The method of claim 6, wherein unreacted metal is removed using an acid etch.

8. The method of claim 3, wherein a plurality of raised source regions are formed.

9. The method of claim 8, wherein the plurality of raised source regions are elongate and have a major and a minor dimension and wherein the major dimensions of the raised source regions are oriented parallel to one another.

10. The method of claim 9, wherein the plurality of raised source regions are spaced apart from one another at regular intervals in the direction of the minor dimension.

11. The method of claim 3, wherein multiple etched structures are formed on a single substrate and wherein etching through the drain layer isolates each etched structure.

12. A method of making a field-effect transistor comprising:

selectively implanting a p-type dopant on a multi-layered structure comprising:
a substrate having opposed first and second surfaces;
a drain layer of an n-type semiconductor material on the first surface of the substrate;
a drift layer of an n-type semiconductor material on the drain layer, the drift layer having a lower conductivity than the drain layer; and
wherein selectively implanting comprises selectively implanting the p-type dopant in the drift layer to form a gate region;

depositing or growing a channel layer of an n-type semiconductor material on the implanted surface of the drift layer; and depositing or growing a source layer of an n-type semiconductor material on the channel layer, the source layer having a higher conductivity than the channel layer;

selectively etching through the source layer, the channel layer and the implanted drift layer to expose underlying drain layer thereby forming raised source/gate regions; and selectively etching through portions of the exposed drain layer to expose underlying substrate thereby forming an etched structure.

13. A method of making a field-effect transistor comprising:

selectively etching a multi-layered structure comprising:
a substrate having opposed first and second surfaces;
a drain layer of an n-type semiconductor material on the first surface of the substrate;
a drift layer of an n-type semiconductor material on the drain layer, the drift layer having a lower conductivity than the drain layer;
a channel layer of an n-type semiconductor material on the drift layer; and a source layer of an n-type semiconductor material on the channel region, the source layer having a higher conductivity than the channel layer;
wherein selectively etching comprises selectively etching through the source and channel layers to expose underlying drift layer thereby forming at least one raised source region;

selectively etching through exposed portions of the drift layer to expose underlying drain layer;

selectively etching through exposed portions of the drain layer to expose underlying substrate thereby forming an etched structure; and selectively depositing a Schottky metal in contact with exposed portions of the drift layer.

14. A field-effect transistor comprising:
a substrate having opposed first and second major surfaces;
a drain layer of an n-type semiconductor material on the first major surface of the substrate;
a drift layer of an n-type semiconductor material on the drain layer and non-coextensive therewith such that portions of the drain layer are exposed, the drift layer having a lower conductivity than the drain layer;
one or more discrete raised regions in spaced relation on the drift layer, each of the raised regions comprising a channel region of an n-type semiconductor material on the drift layer and a source region of an n-type semiconductor material on the channel region, the n-type semiconductor material of the source region having a higher conductivity than that of the channel region;
a metal layer on the drift layer adjacent the one or more raised regions forming a metal-semiconductor rectifying junction with the drift layer and channel region(s); and
ohmic contacts on the source region and on exposed surfaces of the drain layer.

15. The field-effect transistor of claim 14, wherein the source region is coextensive with the channel region.

* * * * *